(12) United States Patent
Lin et al.

(45) Date of Patent: Jul. 9, 2013
(10) Patent No.: US 8,482,952 B2

(54) ONE TIME PROGRAMMING BIT CELL

(75) Inventors: Sung-Chieh Lin, Zhubei (TW); Wei-Li Liao, Taichung (TW); Kuoyuan (Peter) Hsu, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 188 days.

(21) Appl. No.: 13/029,552

(22) Filed: Feb. 17, 2011

(65) Prior Publication Data

US 2012/0212993 A1    Aug. 23, 2012

(51) Int. Cl.
*G11C 17/00* (2006.01)

(52) U.S. Cl.
USPC .............................. 365/104; 365/96

(58) Field of Classification Search
USPC ........................ 365/104, 96, 225.7
See application file for complete search history.

(56) References Cited

U.S. PATENT DOCUMENTS

| | | |
|---|---|---|
| 6,706,571 B1 | 3/2004 | Yu et al. |
| 6,858,478 B2 | 2/2005 | Chau et al. |
| 6,927,997 B2 * | 8/2005 | Lee et al. ............. 365/177 |
| 7,110,313 B2 | 9/2006 | Huang |
| 7,190,050 B2 | 3/2007 | King et al. |
| 7,247,887 B2 | 7/2007 | King et al. |
| 7,265,008 B2 | 9/2007 | King et al. |
| 7,307,880 B2 | 12/2007 | Ko et al. |
| 7,508,031 B2 | 3/2009 | Liu et al. |
| 7,528,465 B2 | 5/2009 | King et al. |
| 7,605,449 B2 | 10/2009 | Liu et al. |
| 2005/0153490 A1 | 7/2005 | Yoon et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2008/0290470 A1 | 11/2008 | King et al. |
| 2008/0296632 A1 | 12/2008 | Moroz et al. |
| 2009/0181477 A1 | 7/2009 | King et al. |
| 2010/0202184 A1 | 8/2010 | Lee |

* cited by examiner

*Primary Examiner* — Huan Hoang
(74) *Attorney, Agent, or Firm* — Lowe Hauptman Ham & Berner, LLP

(57) ABSTRACT

A one time programming (OTP) memory cell includes a first transistor and a second transistor. The first transistor has a first drain, a first source, a first gate, and a first normal operational voltage value higher that a second normal operational voltage value of the second transistor. The second transistor has a second drain, a second source, and a second gate. The first source is coupled to the second drain. The second source is configured to detect data stored in the OTP memory cell.

21 Claims, 5 Drawing Sheets

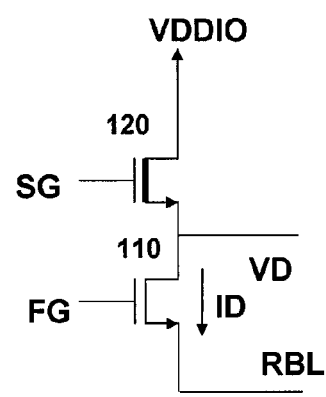

200

| PGM1 | VPP1 |
|------|------|
| BL1  | 0V   |
| SG1  | VPP2 |
| FG1  | 0V   |
| PGM2 | 0V   |
| BL2  | 0V   |
| SG2  | 0V   |
| FG2  | 0V   |

FIG. 4   400

| | |
|---|---|
| PGM1 | 0V |
| BL1 | connect to SA1 |
| SG1 | VDDIO |
| FG1 | VDDCORE |
| PGM2 | 0V |
| BL2 | connect to SA2 |
| SG2 | 0V |
| FG2 | 0V |

FIG. 5 500

ONE TIME PROGRAMMING BIT CELL

FIELD

The present disclosure is related to a one time programming bit cell.

BACKGROUND

Current approaches usually use poly or metal fuses to form a one time programming (OTP) memory cell. In many situations, however, both poly and metal fuses require a large program current to produce the high post-program resistance. As a result, the memory cells are large because they include large transistors or devices to handle the large program current. A memory cell is commonly called a bit cell. An OTP bit cell is also called a fuse cell because the OTP bit cell includes a fuse.

BRIEF DESCRIPTION OF THE DRAWINGS

The details of one or more embodiments of the disclosure are set forth in the accompanying drawings and the description below. Other features and advantages will be apparent from the description, drawings, and claims.

FIG. 1 is a diagram of an OTP memory cell, in accordance with some embodiments.

FIG. 4 is a table illustrating a program operation of the memory array in FIG. 3, in accordance with some embodiments.

FIG. 5 is a table illustrating a read operation of the memory array in FIG. 3, in accordance with some embodiments.

Like reference symbols in the various drawings indicate like elements.

DETAILED DESCRIPTION

Figure 2:
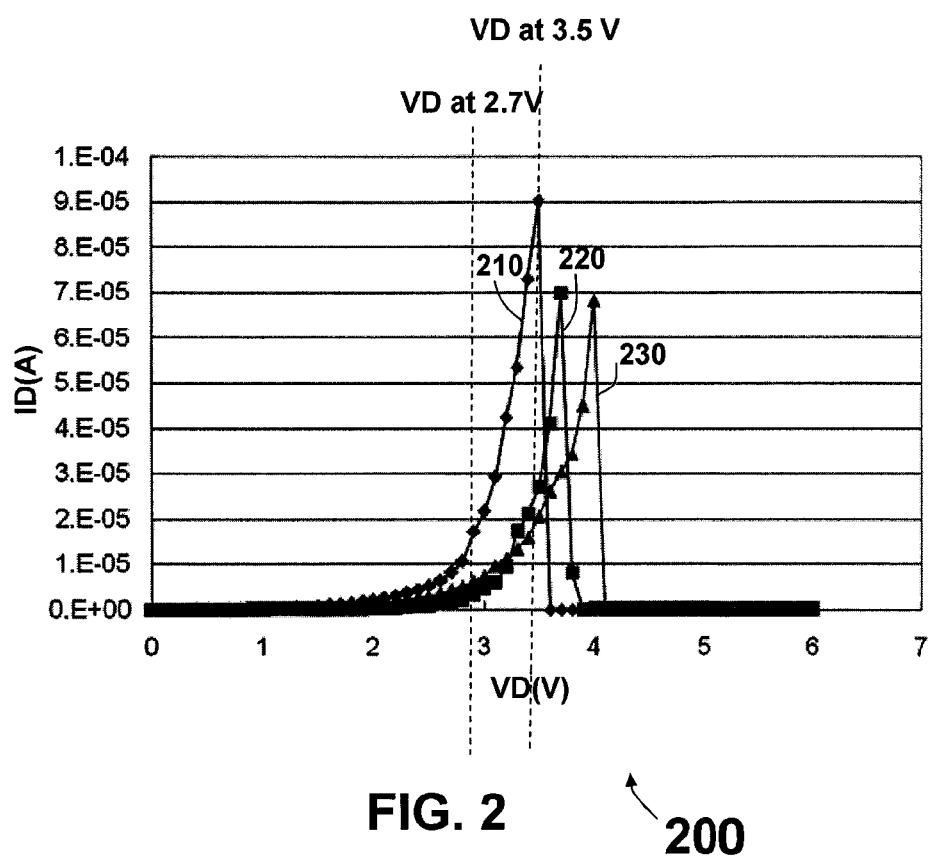
FIG. 2 is a graph of curves illustrating the relationships between voltage VD and current ID, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to persons of ordinary skill in the pertinent art. Reference numbers may be repeated throughout the embodiments, but they do not require that feature(s) of one embodiment apply to another embodiment, even if they share the same reference number.

Various embodiments have one or a combination of the following features and/or advantages. The two transistor or 2T bit cell includes a select transistor and a fuse transistor. The fuse transistor is configured to function as a fuse, and has a high resistance Rprog when the transistor is turned on after being programmed. The program voltage is high while the program current is small. For example, resistance Rprog is about 1 MΩ, the programming voltage is 3.5 V while the program current is 100 μA. The size of the 2T bit cell is small, e.g., about 1 μm$^2$ compared to about 8.5 μm$^2$ of another approach. Because the bit cell size is reduced, the macro density increases. Further, because of the small program current, a bit line is coupled to additional bit cells, which is advantageous over metal and poly fuses that have higher program currents and thus limit the number of cells being coupled to the bit line.

Exemplary OTP Bit Cell

FIG. 1 is a diagram of an illustrative OTP memory cell or OTP bit cell 100, in accordance with some embodiments. Bit cell 100 is called a two transistor or 2T bit cell because bit cell 100 includes two transistors 110 and 120.

Select transistor 120 is coupled in series with fuse transistor 110. The drain of transistor 120 is coupled to an input output (IO) voltage source VDDIO. In some embodiments, voltage source VDDIO is used for IO devices. The source of transistor 120 is coupled to the drain of transistor 110. The source of transistor 110 is coupled to a read bit line RBL of a memory array. Detecting the logic level at read bit line RBL reveals the data stored in memory cell 100.

In some embodiments, both transistors 120 and 110 are available in a memory platform. With respect to the memory platform, transistor 120 is called an IO transistor or device, and is used for IO interfaces. In contrast, transistor 110 is used as a core transistor. With respect to OTP memory cell 100, transistor 120 is called a select transistor and transistor 110 is called a fuse transistor. When select transistor 120 is turned on, memory cell 100 is selected for reading or programming the data reflected by the state of fuse transistor 110. Because IO transistors 120 are available for use with core transistors 110 to manufacture memory cells 100, there is no additional cost to manufacture a select transistor 120 having different characteristics than those of a fuse transistor 110. As a result, cost of manufacturing memory cells 100 is reduced.

As an IO device in a memory platform, transistor 120 is used to interface with other circuitry. Transistor 120 is operated with an operational voltage VDDIO higher than operational voltage VDDCORE (not labeled) of transistor 110. In some embodiments, the normal operational voltage VDDIO for transistor 120 is about 1.5 V while the normal operational voltage VDDCORE for transistor 110 is about 0.85 V. As a result, transistor 120 is commonly called a 1.5 V transistor while transistor 110 is commonly called a 0.85 V transistor. IO transistor 120 has a thicker gate oxide thickness and a longer gate length than core transistor 110.

As a core device in a memory platform, transistor 110 is used to manufacture memory cells that store data. Compared with IO transistor 120, core transistor 110 operates at a lower voltage, and has less leakage current and a smaller die area.

With respect to OTP memory cell 100, transistor 110 is called a fuse or a fuse transistor 110 because transistor 110 functions as a fuse. When memory cell 100 or transistor 110 is un-programmed, transistor 110 operates normally as a transistor. Stated in the fuse paradigm, fuse 100 is closed. OTP memory cell 100 is considered to store a low logic level (a Low). After OTP memory cell 100 or transistor 110 is programmed, transistor 110 operates with a high resistance and is considered an open circuit. Stated in the fuse paradigm, fuse 110 is blown or open. OTP memory cell 100 is considered to store a high logic level (a High).

In some embodiments, the threshold voltage of transistor 110 is about 0.3V. When memory cell 100 is programmed, voltage VDDIO is set at about 4.0 V, signal SG at the gate of transistor 110 is set at 4.5 V, signal FG at the gate of transistor 120 is set at 0 V or VSS. As a result, signal VD is about 3.8 V. Because the normal operational voltage of transistor 110 is about 0.85 V, and the drain of transistor 110 is at about 3.8 V, the resistance of transistor 110 when transistor 110 is on changes to a higher value. Consequently, transistor 110 functions as a fuse. For example, before being programmed and when transistor 110 is on, the resistance Rnormal of transistor 110 is about 1 KΩ. In contrast, after being programmed, the resistance Rprog of transistor 110 when transistor 110 is on is about 1 MΩ. Stated in the fuse paradigm, fuse 110 is blown because fuse 110 has a high resistance. In some embodiments, programming fuse transistor 110 takes less than about 1 second. Otherwise, select transistor 120 would be damaged because the drain and the gate of transistor 120 are also subject to the high voltage of 4.0 V and 4.5 V, respectively. In some embodiments, transistor 120 is turned off, and the drain of transistor 110 is applied with 3.8 V to program transistor 110.

In some embodiments, the data stored in memory cell is detected at the source of transistor 110 or read bit line RBL. For example, voltage VDDIO is set at 0 V. Signal SG is set at 1.5 V to turn on transistor 120. Signal FG is set at 0.85 V to turn on transistor 110. A current sinking circuitry or a current source of about 100 µA is coupled to the source of transistor 110 or read bit line RBL to sink current from transistor 110. If transistor 110 has not been programmed, resistance Rnormal of transistor 110 is about 1 KΩ, and read bit line RBL is about 100 mV. As a result, RBL is Low. Alternatively stated, OTP memory cell 100 stores a Low. In contrast, if transistor 110 has been programmed, resistance Rprog of transistor 110 is about 1 MΩ, and read bit line is about voltage VDD or 0.85 V. As a result, RBL is High. Stated differently, OTP memory cell 100 stores a High.

In FIG. 1, an IO transistor used as a select transistor 120 is in accordance with some embodiments. Other transistors having an operational voltage higher than the operational voltage of a fuse transistor 110 are within the scope of various embodiments. A select transistor 120 having a high operational voltage is chosen so that when fuse transistor 110 is programmed, select transistor 120 can sustain the high programming voltage used to program transistor 110. In some embodiments, the high voltage used to program transistor 110 lasts for a predetermined time of several seconds that depends on technologies. Transistor 120 is then chosen accordingly. In some embodiments, when fuse transistor 110 is a 0.85 V transistor, exemplary select transistors 120 include 1.5V, 1.8V, 2.5 V, 3.3V, and 5.5 V, etc.

Program Voltage

Voltage VD at the source of select transistor 120 coupled to the drain of fuse transistor 110 is called the program voltage of transistor 110 or of OTP memory cell 100. In some embodiments, the longer the gate length of transistor 110, the higher the program voltage VD for transistor 110. Current ID flowing from the drain of transistor 110 to the source of transistor 110 is call the program current of transistor 110 of OTP memory cell 100.

FIG. 2 is a graph 200 of three ID-VD curves illustrating the behavior of current ID with respect to voltage VD, in accordance with some embodiments. The X-axis represents voltage VD in volts (V). The Y-axis represents current ID in ampere (A). Curves 210, 220, and 230 represent the ID-VD curves when transistor 110 has a gate length of 0.02, 0.025, and 0.03 µm, respectively. Signal SG at the gate of transistor 120 and voltage VDDIO at the source of transistor 120 are floated while signal FG at the gate of transistor 110 is at 0 V.

With respect to curve 210, when voltage VD is in between 0V and about 2.70 V, current ID increases but at a slow rate from 0 A to about 1 µA. As voltage VD increases from 2.70 V to about 3.50 V, current ID increases significantly from about 1 µA to about 9 µA. When voltage VD reaches 3.5 V, transistor 110 breaks down. Stated differently, fuse 110 is blown and acts as an open or a high resistance circuit. Consequently, current ID quickly drops from 9 µA to 0. Voltage VDD at 3.5 V is thus the program threshold voltage of transistor 110 when transistor 110 has a gate length of 0.02 µm.

Both curves 220 and 230 show that the drop of current ID from the respective peak to 0 A occurs after the threshold voltage 3.5 V of curve 210. Explained differently, the program threshold voltage VD of transistor 110 increases as the gate length of transistor 110 increases, because curve 210 corresponds to a gate length of 0.02 µm while lines 220 and 230 correspond to respective gate lengths of 0.025 and 0.03 µm.

In some embodiments, program voltage VD is determined based on the gate length of fuse transistor 110. Select transistor 120 is then examined to provide the determined program voltage VD. For example, appropriate values are selected for voltage VDDIO at the drain of transistor 120 and for signal SG at the gate of transistor 120 that result in voltage VD at the source of transistor 120. The values for voltage VDDIO are a function of the sizes of transistor 120. If transistor 120 has a larger size, then voltage VDDIO is lower. But if transistor 120 is smaller, then voltage VDDIO is higher. The value of voltage VDDIO, however, is limited by the junction breakdown of transistor 120. In some embodiments, the size of transistor 120 is selected to provide the desired voltage VDD to program fuse transistor 110.

Exemplary OTP Memory Array

Figure 3:
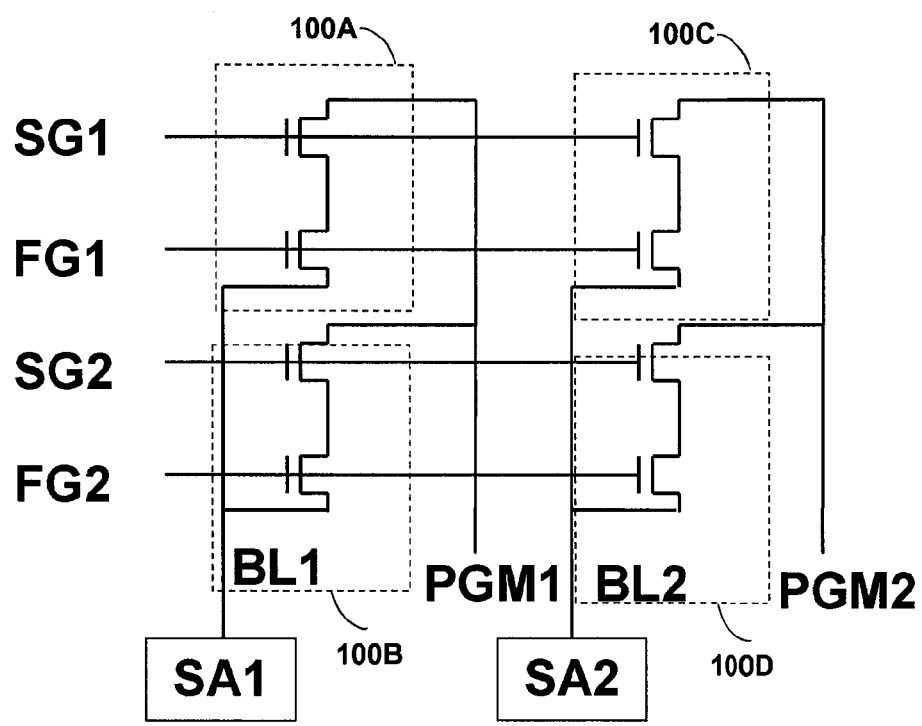
FIG. 3 is a block diagram of an OTP memory array, in accordance with some embodiments.

FIG. 3 is a block diagram of an OTP memory array 300, in accordance with some embodiments. For illustration, array 300 is shown with four OTP memory cells 100A, 100B, 100C, and 100D arranged in two rows R1 and R2 and two columns C1 and C2. To avoid obscuring the drawing, rows R1, R2 and columns C1, C2 are not labeled. Transistors 110 and 120 of each memory cell 100A-100D are also not labeled but should be recognizable by persons of ordinary skill in the art. Memory array 300 is used for illustration. Different numbers of rows and/or columns for memory array 300 are within the scope of various embodiments.

Each of signals SG1 and SG2 corresponds to signal SG in FIG. 1. Signal SG1 couples the gates of transistors 120 of cells 100A and 100C on row R1. Signal SG2 couples the gates of transistors 120 of cells 100B and 100D on row R2.

Each of signals FG1 and FG2 corresponds to signal FG in FIG. 1. Signal FG1 couples the gates of transistors 110 of cells 100A and 100C on row R1. Signal FG2 couples the gates of transistors 110 of cells 100B and 100D on row R2.

Bit line BL1 couples sense amplifier SA1 and the sources of transistors 110 of memory cells 100A and 100B in column C1. Bit line BL2 couples sense amplifier SA2 and the sources of transistors 110 of memory cells 100C and 100D in column C2. Each bit line and a corresponding sense amplifier is used to read a memory cell in the corresponding column. For example, bit line BL1 and sense amplifier SA1 are used to read a memory cell 100A or 100B in column C1. Bit line BL2 and sense amplifier SA2 are used to read a memory cell 100C or 100D in column C2.

Program lines PGM1 couples the drains of transistors 120 of memory cells 100A and 100B in column C1. Program lines PGM2 couples the drains of transistors 120 of memory cells 100C and 100D in column C2. Each program line is used to program a memory cell in a column. For example, line PGM1 is used to program a memory cell 100A or 100B in column C1. Line PGM2 is used to program a memory cell 100C or 100D in column C2.

In some embodiments, one or multiple OTP memory cells is programmed at a time. Further, multiple memory cells in the same row are read at a time. For example, both memory cells 100A and 100B on row R1 are read at a time. Similarly, both memory cells 100B and 100D are read at the same time.

Illustrative Operations of the OTP Memory Array

FIG. 4 is a table 400 illustrating a programming operation of memory array 300, in accordance with some embodiments. In this illustration, memory cell 100A is programmed, but programming other memory cells is performed in a similar manner and should be recognizable by persons of ordinary skill in the art.

Program line PGM2 and bit line BL2 are set to 0 V because neither of memory cells 100C or 100D in column C2 is programmed. Signals SG2 and FG2 are also set to 0 V because neither of memory cells 100B or 100D in row R2 is programmed. Because signal SG2 is set to 0 V, transistors 120 of cells 100B and 100D of row R2 are off and act as open circuits. Similarly, because signal FG2 is set to 0 V, transistors 110 of cells 100B and 100D of row R2 are also off and act as open circuits.

Program line PGM1 is set to voltage VPP1, which is 4.0 V in some embodiments. Signal SG1 at the gate of transistor 120 of cell 100 A is set to voltage VPP2, which is 4.5 V in some embodiments. As a result, voltage VD at the source of transistor 120 and the drain of transistor 110 of cell 100A is about 3.8 V. Consequently, transistor 110 of memory cell 100A breaks down. Alternatively stated, fuse transistor 110 is blown or open, and memory cell 100A is programmed.

FIG. 5 is a table 500 illustrating a read operation of memory 100, in accordance with some embodiments.

Both program lines PGM1 and PGM2 are set to 0 V because there is no programming to any of memory cells 100A, 100B, 100C, or 100D.

Both signals SG2 and FG2 are set to 0 V to turn off transistors 110 and 120 in row R2 because neither of memory cells 100B and 100D in row R2 is read.

Signal SG1 is set to IO operational voltage VDDIO to turn on IO or select transistors 120 of memory cells 100A and 100C in row R1.

Signal FG1 is set to core operational voltage VDDCORE to turn on core or fuse transistors 110 of memory cells 100A and 100C in row R1.

Bit line BL1 and bit line BL2 are coupled to respective sense amplifiers SA1 and SA2 for sense amplifiers SA1 and SA2 to sense or read the data in memory cell 100A in column C1 and memory cell 100C in column C2, respectively.

Each of sense amplifiers SA1 and SA2 senses and provides data reflecting the data stored in memory cell 100A and 100C as illustrated by memory cell 100 in FIG. 1.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logic level (e.g., Low or High) of the various signals used in the above description is also for illustration purposes. Various embodiments are not limited to a particular level when a signal is activated and/or deactivated. Selecting different levels is within the scope of various embodiments.

Some embodiments regard a one time programming (OTP) memory cell that includes a first transistor having a first drain, a first source, and a first gate, and a second transistor having a second drain, a second source, and a second gate. The first transistor has a first normal operational voltage value higher than that of a second normal operational voltage value of the second transistor. The first source is coupled to the second drain. The second source is configured to detect data stored in the OTP memory cell.

Some embodiments regard a one time programming (OTP) memory array that comprises: a plurality of OTP memory cells arranged in rows and columns, a plurality of first signal lines, a plurality of second signal lines, a plurality of program lines, and a plurality of data lines. Each of the plurality of OTP memory cells has a first source of a first transistor coupled to a second drain of a second transistor. The first transistor has a first normal operational voltage value higher a second normal operational voltage value of the second transistor. Each of the plurality of first signal lines is coupled to gates of first transistors in each row. Each of the plurality of second signal lines is coupled to gates of second transistors in each row. Each of the plurality of program lines is coupled to drains of first transistors in each column and is configured to receive a program voltage in each column. Each of the plurality of data lines is coupled to sources of second transistors in each column and is used to detect data stored in OTP memory cells in each column.

Some embodiments regard a method of programming an OTP memory cell having a first source of a first transistor coupled to a second drain of a second transistor, the first transistor having a first normal operational voltage value higher a second normal operational voltage value of the second transistor. The method comprises applying a first voltage value to a drain of the first transistor, the first voltage value being higher than the first normal operational voltage value; applying a second voltage value to a first gate of the first transistor, the second voltage value being higher than the first normal operational voltage value; and applying a third voltage value to a source of the second transistor. The first resistance value of the second transistor when the second transistor is on is changed to a second resistance value higher than the first resistance value.

Some embodiments regard a method of reading an OTP memory cell having a first source of a first transistor coupled to a second drain of the second transistor, the first transistor having a first normal operational voltage value higher than a second normal operational voltage value of the second transistor, a first resistance value of the second transistor when the OTP memory cell is not programmed is less than a second resistance value of the second transistor when the OTP memory cell is programmed. The method comprises turning on the first transistor, turning on the second transistor, and detecting a voltage level at a second source of the second transistor.

The above method illustrates exemplary steps, but they are not necessarily performed in the order shown. Steps may be added, replaced, changed order, and/or eliminated as appropriate, in accordance with the spirit and scope of disclosed embodiments.

What is claimed is:

1. A one time programming (OTP) memory cell comprising:
   a first transistor having a first drain, a first source, and a first gate; and
   a second transistor having a second drain, a second source, and a second gate, wherein
      the first source is coupled to the second drain;

the second source is configured to detect data stored in the OTP memory cell;

the first transistor has a first normal operational voltage value higher than a second normal operational voltage value of the second transistor; and the second transistor is configured to store the data stored in the OTP memory cell.

2. The OTP memory cell of claim 1, wherein the first transistor is an input/output (IO) transistor of a memory platform and the second transistor is a core transistor of the memory platform.

3. The OTP memory cell of claim 1, wherein when the OTP memory cell is programmed:

the first source is configured to receive a first voltage value higher than the first normal operational voltage value;

the first gate is configured to receive a second voltage value higher than the first normal operational voltage value;

the second transistor is configured to be off; and the second source is configured to receive a ground reference voltage value.

4. The OTP memory cell of claim 1, wherein when the OTP memory cell is programmed the first transistor is configured to be off; and the second drain is configured to receive a voltage value higher than the second normal operational voltage value.

5. The OTP memory cell of claim 1, wherein when the OTP memory cell is read the first transistor and the second transistors are configured to be on;

the first drain is configured to receive logic low voltage value; and the second source is configured to coupled to a current sinking circuit.

6. The OTP memory cell of claim 1, wherein the OTP memory cell is coupled to a bit line of a memory array, the bit line being coupled to a plurality of OTP memory cells of the memory array.

7. The OTP memory cell of claim 6, wherein the bit line is further coupled to a sense amplifier.

8. The OTP memory cell of claim 1, wherein the first transistor has a first gate oxide thicker than a second gate oxide of the second transistor.

9. The OTP memory cell of claim 1, wherein the second transistor is a fuse.

10. A one time programming (OTP) memory array comprising:

a plurality of OTP memory cells arranged in rows and columns, each OTP memory cell of the plurality of OTP memory cells having a first source of a first transistor coupled to a second drain of a second transistor; the first transistor having a first normal operational voltage value higher a second normal operational voltage value of the second transistor;

a plurality of first signal lines, each of the plurality of first signal lines is coupled to gates of first transistors in each row;

a plurality of second signal lines, each of the plurality of second signal lines is coupled to gates of second transistors in each row;

a plurality of program lines, each of the plurality of program lines is coupled to drains of first transistors in each column and is configured to receive a program voltage in each column; and a plurality of data lines, each of the plurality of data lines is coupled to sources of second transistors in each column and is used to detect data stored in OTP memory cells in each column.

11. The OTP memory array of claim 10 further comprising a plurality of sense amplifiers, each of the plurality of sense amplifiers is coupled to each data line of the plurality of data lines.

12. The OTP memory array of claim 10, wherein the first transistor of each OTP memory cell of the OTP memory array is an input/output (IO) transistor of a memory platform; and the second transistor of each OTP memory cell of the OTP memory array is a core transistor of the memory platform.

13. A method of programming a one time programming (OTP) memory cell having a first source of a first transistor coupled to a second drain of a second transistor, the first transistor having a first normal operational voltage value higher a second normal operational voltage value of the second transistor, the method comprising:

applying a first voltage value to a drain of the first transistor, the first voltage value being higher than the first normal operational voltage value;

applying a second voltage value to a first gate of the first transistor, the second voltage value being higher than the first normal operational voltage value; and applying a third voltage value to a source of the second transistor;

whereby a first resistance value of the second transistor is changed to a second resistance value higher than the first resistance value when the second transistor is on.

14. The method of claim 13, wherein the first transistor is an input/output (IO) transistor of a memory platform and the second transistor is a core transistor of the memory platform.

15. The method of claim 13, wherein the first voltage value and/or the second voltage value is determined based on a program voltage value at the first source of the first transistor coupled to the second drain of the second transistor.

16. The method of claim 15, wherein the first voltage value is determined further based on a size of the first transistor.

17. The method of claim 15, wherein the program voltage value is determined based on a gate length of the second transistor.

18. The method of claim 15, wherein the program voltage value changes the first resistance value to the second resistance value.

19. A method of reading a one time programming (OTP) memory cell having a first source of a first transistor coupled to a second drain of a second transistor, the first transistor having a first normal operational voltage value higher than a second normal operational voltage value of the second transistor, the method comprising:

turning on the first transistor;

turning on the second transistor; and detecting a voltage level at a second source of the second transistor, the voltage level dependent on resistance of the second transistor, the resistance of the second transistor having a first resistance value when the OTP memory cell is not programmed and a second resistance value when the OTP memory cell is programmed, the first resistance value less than the second resistance value.

20. The method of claim 19, wherein detecting the voltage level at the second source of the second transistor comprises using a current sinking circuit at the second source.

21. The method of claim 19, wherein the first transistor is an input/output (IO) transistor of a memory platform and the second transistor is a core transistor of the memory platform.

* * * * *